Dec. 15, 1964 B. COHN ETAL 3,161,521

METHOD OF MAKING LITHOGRAPHIC PRINTING PLATES

Filed March 30, 1962

BERNARD COHN
HARRY LOPETZ
JITENDRA N. SHAH
INVENTORS.

BY

Karl F. Ross

AGENT

United States Patent Office 3,161,521

Patented Dec. 15, 1964

3,161,521

METHOD OF MAKING LITHOGRAPHIC PRINTING PLATES

Bernard Cohn, Elmsford, Harry Lopetz, Katonah, and Jitendra N. Shah, Mount Vernon, N.Y., assignors to Technilith Inc., Mount Vernon, N.Y., a corporation of New York Filed Mar. 30, 1962, Ser. No. 183,817

6 Claims. (Cl. 96—75)

Our present invention relates to an improved method of making lithographic printing plates and to plates made by this method.

Heretofore, presensitized lithographic printing plates usually used either a metallic or a paper substrate. While the metal plates are satisfactory, they are comparatively expensive especially when used for short press runs. Conversely, while the paper plates are relatively inexpensive, they suffer from waterlogging, i.e., they absorb water while being run on the press, yield poor-quality prints, do not register, and eventually tear at the clamp edges.

It is an object of our invention, therefore, to provide an improved method of making lithographic printing plates with a large variety of substrates.

Another object of the invention is to provide a lithographic plate with an improved hydrophilic surface as well as a method of making same.

A more specific object of our invention, therefore, is to provide a method of making lithographic plates using relatively water-impermeable materials (e.g., plastics) as substrates, and it is a further object to provide a method of making lithographic plates from normally water-absorbent materials (e.g., paper), whose hydrophilic surface is nevertheless substantially impervious to water, thus obviating the above-mentioned defects.

The above and other objects, which will become more readily apparent subsequently, have been realized, according to our invention, by providing a substrate with a layer of a titanium compound, advantageously in the form of an organic titanate, which is firmly bonded to the substrate. Most satisfactory results are obtained when the organic titanate is hydrolyzable under humid conditions to evolve gaseous hydrolysis products leaving behind a highly hydrophilic titanate deposit which coats the substrate substantially uniformly. We have found that a high-molecular-weight organic titanate and, more particularly, a stereosymmetric alkyl titanate such as tetrakis (2-ethylhexy) titanate which has the apparent structural formula

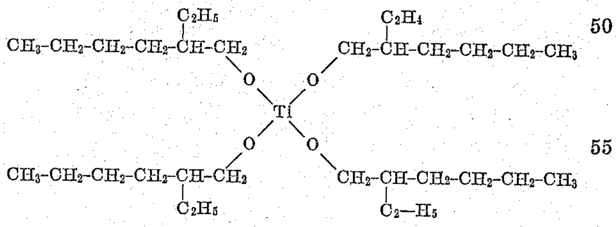

is most suitable for use as a hydrophilic layer on nonmetallic substrates.

For instance, we may use a flexible substrate, such as a plastic foil or a paper sheet, and size same to make it receptive to the organic titanate which is applied in a solution of the titanate in a vaporizable solvent. The latter, which of course should be nonaqueous to avoid premature hydrolysis of the organic titanate, may be a short-chain alcohol (e.g., having from 1 to 5 carbon atoms), an alkyl hydrocarbon liquid at room temperature (e.g., one having from 6 to 8 carbon atoms), a halogenated hydrocarbon such as carbon tetrachloride, or an aromatic hydrocarbon such as benzene or toluene. Advantageously, the boiling point of the solvent should be somewhat less than or, at most, only slightly greater than 100° C. for a reason to be pointed out subsequently.

The substrate, carrying the titanate solution, is then subjected to a temperature above or equal to the boiling point of the solvent to drive it off, leaving a layer of the hydrolyzable titanate on the coated surface of the substrate. The titanate is hydrolyzed in the presence of moisture, preferably at an elevated temperature, so that the volatile hydrolysis products are expelled and a hydrophilic coating of a titanate, whose precise structure has not been ascertained, is formed on the substrate. While the foregoing steps may be carried out with individual sheets of, say, slate glass or flexible material, it will be apparent that the method is also realizable in a continuous process, in which case a flexible continuous band of substrate is coated with the organic titanate solution, passed into a heating chamber or subjected to heat from a radiant source or conveyor roller, and subsequently or simultaneously hydrolyzed in a continuous manner. The boiling temperature of the solvent is preferably less than 100° C., as stated above, so that, after a limited initial heating of the substrate to drive off most of the solvent, the organic titanate may be subjected to steam to effect simultaneous hydrolysis and vaporization of any residual solvent.

The hydrophilic coating is then covered by a light-sensitive lithographic compound, such as a photoreactive diazo polymeric resin or other nitrogen-containing organic compound, which has light-stabilizing or light-solubilizing qualities. These polymeric compounds, which may be of the type disclosed in U.S. Patent No. 2,063,631 to Schmidt and Zahn, have been found to adhere well to the titanate layer upon their exposure to actinic (i.e., ultraviolet) light. The nonexposed portions of the generally water-soluble diazo compounds may readily be washed from the plate. The resulting lithographic printing sheet or plate is then ready for "developing" treatment (i.e., preparation to accept the ink). This preparation may involve the swabbing of the reproducing surface with a glycerine or gum arabic solution. The diazo compound may be a condensation polymer of formaldehyde and para-diazodiphenylamine or a diazo derivative of a diphenylamine carboxylic acid. These and similar polymeric nitrogen compounds, which upon exposure to actinic light release nitrogen to form hydrophobic compounds readily wetted by the oil-based ink while the nonactivated portions remain soluble in aqueous solution, yield highly stable presensitized plates with long shelf life when used in conjunction with the titanate undercoat mentioned and, especially, when employed in conjunction with undercoats having a tetrakis(2-ethylhexyl) titanate base.

The tetrakis(2-ethylhexyl) titanate may be applied to the substrate in the form of a solution containing upwards of about 0.2% of the titanate but preferably ranging between 2.0 and 15.0% by weight of the solution, the remainder being one of the aforementioned solvents (e.g., methanol, n-butanol, toluene or hexane), or directly to the substrate without the aid of a solvent. It should be noted, however, that the latter case requires considerable care to obtain a uniform coating of the tetrakis(2-ethylhexyl) titanate, which has a viscosity at 25° C. of about 103 centipoises, while solutions of the compound in concentrations less than about 15% are substantially less viscous since they have the viscosity characteristics of their solvents and, consequently, spread more readily; methanol, for example, has a viscosity at 20° C. of 0.6 centipoise.

We have found that the adhesion of the hydrolysis residue of tetrakis(2-ethylhexyl) titanate to the substrate is facilitated if the surface gloss of the substrate is reduced below that characterizing such substrates as polyethyleneterephthalate-resin films (i.e., those marketed under the name "Mylar") and glass. Thus, we prefer to treat the receiving surface of the substrate with preferably polymeric deglossing compounds (e.g., epoxy or polyvinyl resins) to produce a surface finish adapted to give a gloss reading (i.e., measurement of the ratio of the intensity of the light reflected regularly from the surface to the intensity of the total reflected light) of about 5 as measured by a conventional glossmeter. The tetrakis(2-ethylhexyl) titanate is then deposited upon the so treated surface. Similar treatments may be employed with cellulose-acetate and polyethylene substrates which are also suitable for the present purposes.

While, as described above, steam may be employed to hydrolyze the tetrakis(2-ethylhexyl) titanate, the hydrolysis may also be carried out with ambient relative humidities ranging between substantially 15 and 100% at temperatures of substantially 200° F. (93.5° C.) for periods of 30 to 45 seconds. The result is a substrate to which the hydrolysis residue of tetrakis(2-ethylhexyl) titanate is bonded firmly.

The above and other objects, features and advantages of the instant invention will become more readily apparent from the following description, reference being made to the accompanying drawing in which.

Figure 1:
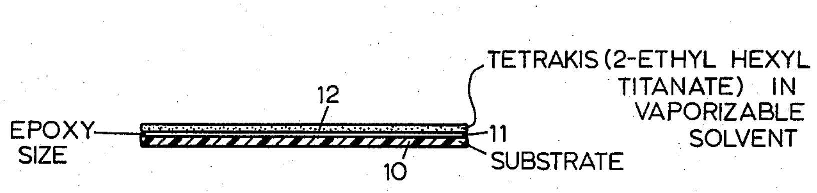
FIG. 1 is a cross-sectional view of a synthetic-resin foil provided with a layer of tetrakis(2-ethylhexyl) titanate, according to the invention, with the several layers constituting the composite shown on an enlarged scale and disproportionately dimensioned for purposes of illustration.
Figure 2:
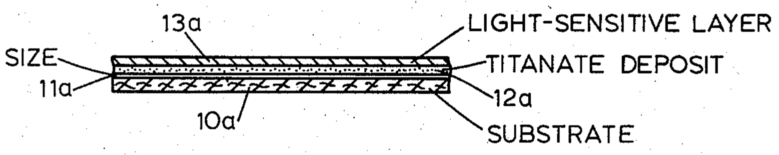
FIG. 2 is a view similar to FIG. 1 illustrating a further step in the process according to the invention.
Figure 3:
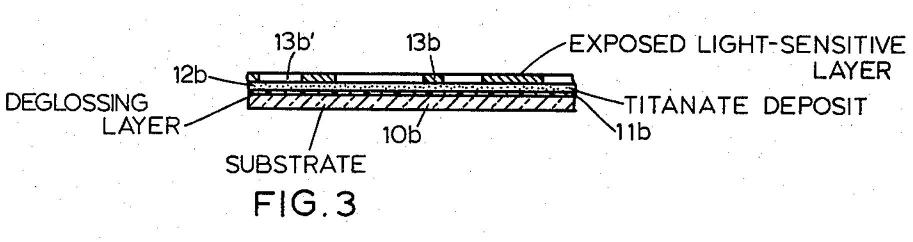
FIG. 3 is yet another view similar to FIG. 1 showing a finshed lithograph plate.

In FIG. 1 of the drawing we show a synthetic resin or like substrate, which may be polyethyleneterephthalate ("Mylar"), cellulose acetate or polyethylene, represented by the plastic foil 10, whereon a deglossing agent 11 such as an epoxy resin containing the requisite amount of a flatting substance (e.g., silica or zinc stearate) is deposited. Upon the top surface of the epoxy size or delustering layer 11 the organic-titanate layer 12 is deposited in accordance with one of the following examples. FIG. 2 shows an unsensitized lithographic plate wherein the substrate 10*a* is a fibrous material, such as a heavy kraft paper or a paper impregnated with a synthetic resin, which is coated with a thin layer 11*a* of a size (e.g., a silica gel or adhesive). Upon the latter, a titanate deposit 12*a* is formed and coated with a light-sensitive layer 13*a*. The plate shown in FIG. 3 has been sensitized by exposure to actinic light through a negative so that the light-sensitive layer 13*b* is removed in areas 13*b'* from which the water-soluble material has been swept by washing. Thus, the hydrophilic titanate underlayer 12*b* is exposed. The titanate layer 12*b* is carried by a plate 10*b* of glass, which constitutes the substrate, via a deglossing layer 11*b* (e.g., a polymeric vinyl compound containing flatting agents).

*Example 1*

Upon a sheet of a polyester film, such as polyethyleneterephthalate ("Mylar"), having a thickness of 0.005 inch (about 0.125 mm.), an epoxy layer or size having a thickness of 0.0001–0.00025 inch is deposited. The epoxy is a low-molecular-weight condensation polymer of epichlorohydrin and p,p'-isopropylidenediphenol, such as that marketed under the trade name "Epon 1001," which is a solid at room temperature and is deposited upon the Mylar substrate from a 10% solution of the resin containing 2%, by weight, of silica as a flatting or delustering agent. The epoxy layer is then dried in air and coated with a 10% solution of tetrakis(2-ethylhexyl) titanate in methanol. The composite is then heated to a temperature of about 220° F. (ca. 105° C.) to drive off the solvent. Hydrolysis of the titanate is then induced by introducing steam into the heating chamber or by merely raising the humidity thereof, whereupon the continued heating removes the volatile hydrolysis products while leaving a hydrophilic titanate residue. The composite is then cooled and a 2% solution of a light-sensitive diazo compound, prepared in accordance with Example 1 of U.S. Patent No. 2,063,631, is applied. The diazo compound is a polymeric material prepared by condensing the sulfate salt of diazotized 4-amino 1,1'-diphenylamine with paraformaldehyde in the presence of sulfuric acid. When the light-sensitive layer is dry, the resulting plate may be exposed to actinic light through a negative, whereupon the nonexposed portions may be washed off with a 20% glycerine solution while the exposed portions remain fixed to the titanate underlayer as hydrophobic lands adapted to pick up ink.

*Example 2*

A heavy sheet of sized paper (sheet 10*a*) is swabbed with a 20% solution of tetrakis (2-ethylhexyl) titanate in hexane and heated immediately thereafter to 212° F. (100° C.) in a humid atmosphere (from 15 to 100% relative humidity) to evaporate the hexane solvent. Hydrolysis follows if the relative humidity is about 40% or may be induced by blanketing the tetrakis (2-ethyl-hexyl) titanate layer with steam. Heating is maintained for 30 to 45 seconds in order to effect substantially complete hydrolysis and to expel all of the volatile hydrolysis products. The substrate, coated with a hydrophilic titanate layer, is then cooled and a 1% solution of the light-sensitive polymeric diazo compound used in Example 1 is wiped onto the titanate layer. Again the resulting plate is exposed to actinic light through a negative transparency prior to mounting on an offset-printing press. To "develop" the plate, it is swabbed with an 8-Bé. aqueous solution of acacia gum (gum arabic).

*Example 3*

A sheet of cellulose triacetate having a thickness of 0.005 inch is coated with a film of polyester resin (e.g., polyethylene terephthalate) from a 12% solution of the resin containing sufficient silica flatting agent to yield a surface having a gloss reading of 5. The gloss reading is taken with an 85° Gardiner glossmeter. The sheet is heated to a temperature of 200° F. (ca. 94° C.) to set the film, whereupon a first coating of tetrakis (2-ethylhexyl)titanate is applied from a 5% solution of the compound in toluene. The coating is then heated to a temperature between 95° and 120° C. to evaporate the solvent and to hydrolyze the tetrakis-(2-ethylhexyl) titanate in an atmosphere having a relative humidity of 40%. A second coating of tetrakis (2-ethylhexyl) titanate is then deposited and treated in like manner. Subsequently, the hydrophilic titanate layer is wiped with an aqueous solution containing 4% of the light-sensitive diazo compound used in the preceding examples as its sulfonate salt. The resulting plate may then be exposed to actinic light and developed as previously described.

*Example 4*

A sheet 10*b* of glass is coated with a 10% solution of copolymerized vinyl chloride and vinyl acetate in methyl ethyl ketone. To the copolymer, which may be the product marketed under the name "Vinylite VMCH," is added 5%, by weight, of silicia flatting agent. When the polyvinyl layer (11*b*) is dry, it is swabbed with a 10% solution of tetrakis (2-ethylhexyl) titanate in n-butyl alcohol and immediately heated in a dry atmosphere to a temperature of about 120° C. to drive off the stolvent. The tetrakis (2-ethylhexyl) titanate layer is then exposed to a jet of steam of effect hydrolysis and the resultant evolution of gaseous hydrolysis products to leave the titanate layer 12*b*. The plate is then cooled and coated with a 2.5% solution of diazotized 4-amino-3,6-dimethoxydiphenylamine-2′-carboxylic acid, which is light-sensitive and may be exposed and developed in the usual manner.

Figure 4:
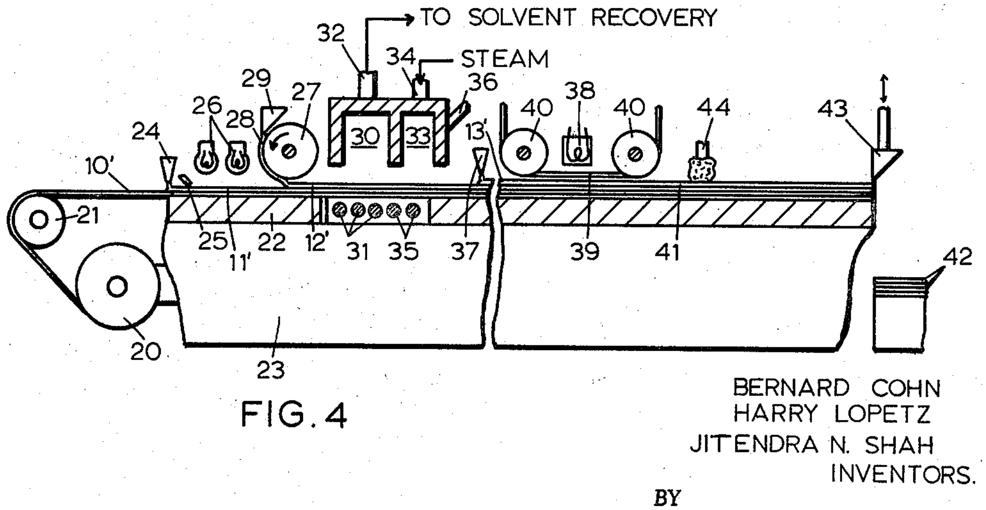
FIG. 4 is a diagrammatic view illustrating a continuous process for producing lithographic plates according to the invention.

In FIG. 4 we show, somewhat schematically, the continuous production of lithographic plates. The flexible substrate 10′, which may be a paper or synthetic resin of the type previously described, is drawn by conventional feed means (not shown) from a supply roll 20 over a deflecting roller 21 along the bed 22 of a treatment table 23. The latter may, of course, be replaced by a continuous band which would then constitute the feed means. A dispenser 24 deposits an epoxy layer 11′ on the upper surface of the foil 10′ while a doctor blade 25 smoothens the coating. As the foil 10′ is displaced to the right along table 22, the epoxy layer is set and dried at a heating station represented by radiant-heating lamps 26 while, at a subsequent station, a solution of tetrakis(2-ethylhexyl)titanate is distributed onto the epoxy surface by an applicator drum 27. The latter receives the titanate solution 28 from a feeding funnel 29 and smoothly coats the layer 11′ with it. From the drum 27, the foil 10′ carrying the organic titanate layer 12′ passes into a heating chamber 30 and is heated by resistance heating elements 31 in table 22. A pipe 32 draws evaporated solvent from chamber 30 to a recovery apparatus in which the solvent is condensed for reuse. From chamber 30 the foil 10′ is passed through a hydrolysis chamber 33 in which it is blanketed by steam introduced through a pipe 34 while elevated temperatures are maintained by the additional heating elements 35 to drive off the volatile hydrolysis products. The latter are removed via an exhaust pipe 36. The resulting strip, coated with a hydrophilic titanate layer, may then be marketed directly for use in printing plants in which it is desired to sensitize the plates just prior to printing. Alternatively, the strip may be passed beneath a further dispenser 37 which coats the strip with a polymeric light-sensitive material of the type previously mentioned. Upon drying, the strip may be severed into plates as described hereinafter, which constitute presensitized plates having a long shelf life. Should it be desired to expose the strip, it may be passed beneath a source 38 of actinic light while a negative transparency 39, shown to be simultaneously displaceable with the foil 10′ upon a pair of rollers 40, is interposed between the source and the foil. The sensitized strip indicated by the reference numeral 41 may be stored in web form or severed into plates 42 by a shear 43. If it is desired to use the plates at once, they may be rinsed with a developer solution by a swab 44.

The invention described and illustrated is believed to admit of many modifications and variations regarded as within the ability of one skilled in the arts and intended to be included within the spirit and scope of the appended claims.

We claim:

1. A method of making a printing plate, comprising the stages of coating a flexible substrate with tetrakis(2-ethyl-hexyl)titanate so as to form a hydrophilic layer upon said substrate, hydrolyzing said layer, and depositing a photosensitive layer of a polymeric diazo compound upon said hydrophilic layer.

2. A method of making a printing plate comprising the steps of depositing tetrakis(2-ethylhexyl)titanate in an organic vehicle boiling below about 100° C. upon a flexible substrate so as to form a hydrophilic layer thereon, hydrolyzing said layer by subjecting it to treatment with a humid atmosphere, thereby driving off volatile products of the hydrolysis of said tetrakis(2-ethylhexyl)titanate and coating said hydrophilic layer with a photosensitive polymeric diazo compound.

3. A method of making a printing plate comprising the steps of depositing tetrakis(2-ethylhexyl)titanate in an organic vehicle boiling below about 100° C. upon a flexible substrate so as to form a hydrophilic layer thereon, hydrolyzing said layer by subjecting it to treatment with a steam atmosphere, thereby driving off volatile products of the hydrolysis of said tetrakis(2-ethylhexyl)titanate and simultaneously driving off at least part of said solvent.

4. A printing plate comprising a flexible substrate, a hydrophilic layer of hydrolyzed tetrakis(2-ethylhexyl)-titanate on said substrate and a photosensitive layer of a polymeric diazo compound overlying said hydrophilic layer.

5. A printing plate comprising a flexible nonmetallic substrate, a hydrophilic layer of hydrolyzed tetrakis(2-ethylhexyl)titanate on said substrate, a polymeric delustering agent interposed between said hydrophilic layer and said substrate, and a photosensitive layer of a polymeric diazo compound overlying said hydrophilic layer.

6. A printing plate comprising a flexible substrate, a hydrophilic layer of hydrolyzed tetrakis(2-ethylhexyl)-titanate on said substrate and a photosensitive layer of a polymeric diazo compound constituted by a condensation polymer of formaldehyde and a diazodiphenylamine overlying said hydrophilic layer.

References Cited by the Examiner

UNITED STATES PATENTS

| | | | |
|---|---|---|---|
| 1,964,358 | 6/34 | Krieger | 96—75 X |
| 2,676,102 | 4/54 | Boyd et al. | 96—87 |
| 2,686,354 | 8/54 | Lundin | 29—495 |
| 2,720,468 | 10/55 | Schacklett | 117—34 |
| 2,946,683 | 7/60 | Mellan et al. | 96—75 |
| 2,983,221 | 5/61 | Dalton et al. | 96—33 X |
| 2,989,417 | 6/61 | Overman | 96—67 X |

NORMAN G. TORCHIN, *Primary Examiner.*